United States Patent [19]

Aslan

[11] Patent Number: 4,605,905

[45] Date of Patent: Aug. 12, 1986

[54] AMPLIFIER INPUT CIRCUITRY WITH COMPENSATION FOR PYROELECTRIC EFFECTS

[75] Inventor: Edward E. Aslan, Plainview, N.Y.

[73] Assignee: The Narda Mircowave Corporation, Hauppauge, N.Y.

[21] Appl. No.: 667,324

[22] Filed: Nov. 1, 1984

[51] Int. Cl.⁴ .............................................. H03F 1/02
[52] U.S. Cl. ....................................... 330/9; 330/146; 330/289
[58] Field of Search .................... 330/9, 146, 289, 297, 330/302

[56] References Cited

U.S. PATENT DOCUMENTS 3,387,206  6/1968  Sampson .............................. 330/289

Primary Examiner—Eugene R. LaRoche
Assistant Examiner—Steven J. Mottola
Attorney, Agent, or Firm—Eisenman, Allsopp & Strack

[57] ABSTRACT

A bridge circuit for use with high gain high impedance direct-current amplifiers, when the input circuitry includes components subject to pyroelectric effects. The bridge includes temperature responsive elements connected to an adjustable direct-current voltage supply and produces a control voltage that compensates for changes in the zero offset of the input, due to such pyroelectric voltages.

2 Claims, 1 Drawing Figure

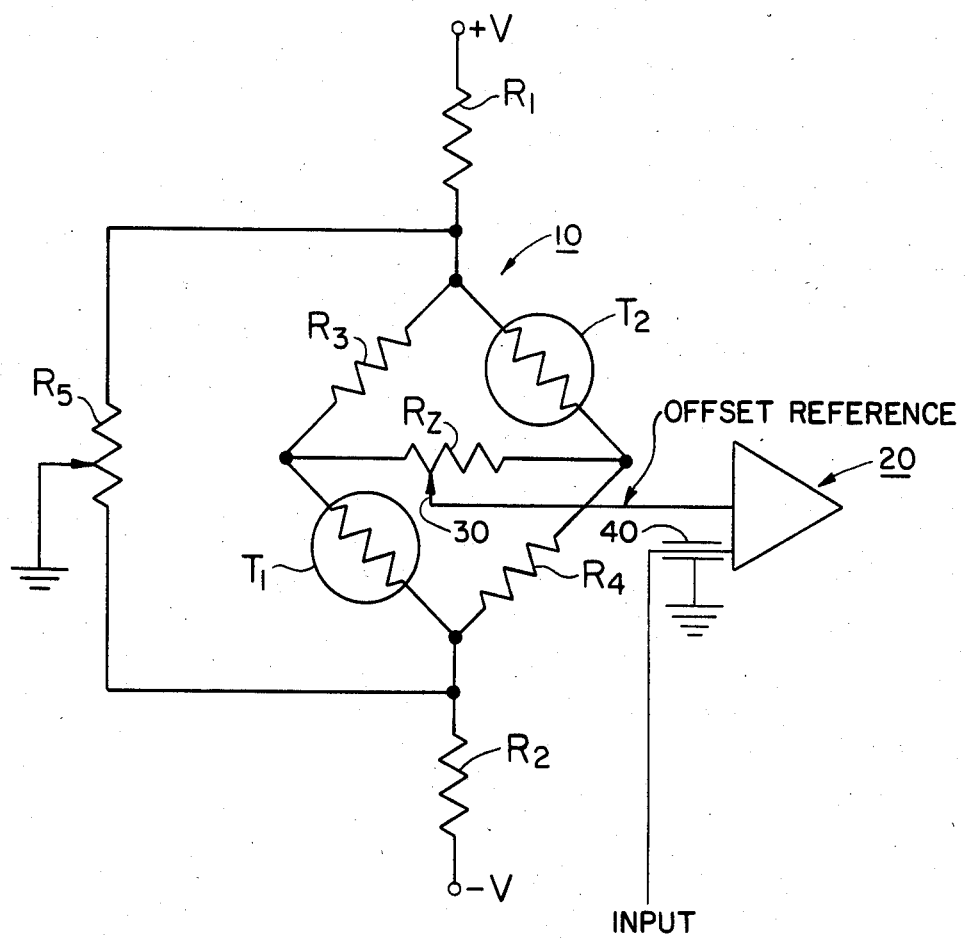

AMPLIFIER INPUT CIRCUITRY WITH COMPENSATION FOR PYROELECTRIC EFFECTS

BACKGROUND OF THE INVENTION

1. Field of the Invention

This invention relates to direct-current amplifiers and more particularly, to improvements in direct-current amplifiers to compensate for zero offsets due to generation of pyroelectric voltages.

2. Description of the Prior Art

The pyroelectric effect experienced with certain crystalline solids is a temperature dependent function of the polarization of such solids. When the temperature of the solid changes, a voltage is developed across it. It is recognized that the zero offset associated with high gain or low level direct-current amplifiers is principally a result of variations within the amplifiers themselves; however, when high gain, high input impedance amplifiers are used in conjunction with capacitors at the input circuitry, the pyroelectric effect becomes important. A zero offset may occur in such instances due to the generation of pyroelectric voltages. The dielectric materials in such capacitors exhibit spontaneous electric polarization. The internal dipole moment changes with temperature and produces a temperature dependent charge distribution. This in turn manifests itself as an offset voltage.

SUMMARY OF THE INVENTION

The present invention compensates automatically for zero offsets created by high impedance feedthrough circuitry at the input of high gain high impedance amplifiers. This is effected by developing a "reference zero" for such amplifiers that is equal and opposite to the pyroelectric generated voltages.

An object of the invention is to provide improved high gain high impedance direct-current amplifiers.

Another object of the invention is to provide improved high gain high impedance direct-current amplifiers having temperature correction of the zero offset.

Another object of the invention is to provide improved high gain high impedance direct-current amplifiers having compensation for zero offset caused by pyroelectric voltages created in high impedance feedthrough circuitry at the input thereof.

In a particular embodiment of the invention, there is disclosed a high gain high impedance amplifier operating with imput circuitry subject to pyroelectric effects. A bridge circuit is provided having temperature responsive impedances in one set of opposing legs and fixed impedances in the second set of opposing legs; a potentiometric device being connected across one diagonal of the bridge and a direct-current reference voltage being connected across the other diagonal. Means are provided to establish a bias level for said reference voltage, whereby the arm of said potentiometer provides an offset voltage for application to said amplifier that compensates for the pyroelectric effects occurring as the ambient temperature changes.

The invention will be more thoroughly understood and appreciated from the following description which is made in conjunction with the drawing.

BRIEF DESCRIPTION OF THE DRAWING

The FIGURE is a circuit schematic showing circuitry embodying the features of the invention.

DESCRIPTION OF THE PREFERRED EMBODIMENT

As noted above, it is necessary to compensate for the zero offset experienced with high gain or low level direct-current amplifiers, and associated with temperature change. The bridge 10 illustrated in the FIGURE develops a reference voltage for the high gain high impedance amplifier 20. Amplifier 20 may be a commutating auto-zero instrumentation amplifier used for low frequency applications from direct current to 10 Hz. Such an amplifier may include automatic compensation for long-term drift phenomena and temperature effects and a capacitor 40 input. Examples of such an amplifier are those identified as ICL 7605 and ICL 7606 provided by Intersil, Inc. of Cupertino, California.

Bridge 10 is connected between positive and negative direct-current voltage sources $+V$ and $-V$, by resistances $R_1$ and $R_2$, respectively. The bridge comprises a first leg between $R_1$ and $R_2$, including a serially connected fixed resistance $R_3$ and thermistor $T_1$; and a second leg between $R_1$ and $R_2$, including serially connected thermistor $T_2$ and fixed resistance $R_4$. The junctions between the resistance and thermistor in each leg are connected to the opposite ends of a zero offset potentiometer $R_Z$. A second potentiometer $R_5$ is connected in parallel with the bridge between resistances $R_1$ and $R_2$. The arm of this second potentiometer is grounded, or selectively biased to a direct-current voltage level between sources $+V$ and $-V$.

$R_5$ establishes the zero reference voltage level at the output of arm 30 on potentiometer $R_Z$, at 25° C. or mean room ambient temperature. Resistances $R_3$, $R_4$ are equal and constant at all temperatures. Thermistors $T_1$, $T_2$ are of resistance equal to $R_3$, $R_4$ at 25° C. or mean room ambient temperature, and vary as a function of temperature change. Thus, there is a linear change of voltage at arm 30 as a function of temperature change, the rate and polarity of change being determined by the position of the arm itself.

The bridge is balanced at 25° C. due to the abovedescribed component selection, and the position of potentiometer arm 30 has no effect. Thereafter, as the temperature (and therefor thermistor resistance) varies, the bridge becomes unbalanced and produces a potential difference across the zero reference potentiometer $R_Z$. $R_Z$ is provided to selectively match the offset, both with respect to polarity and rate of change, and compensate for the pyroelectric generated voltage. Arm 30 positions to either side of the center of potentiometer $R_Z$, provide either positive or negative corrections. The relative position of arm 30 with respect to the center, establishes the voltage magnitude and hence the rate of change with respect to temperature.

At the 25° C. ambient temperature, $R_5$ is adjusted for a proper zero reference to satisfy operation of the amplifier 20. $R_Z$ is then adjusted to yield the proper amplifier zero at elevated temperatures.

A particular embodiment of the invention has been described. It will be appreciated that modifications will be apparent to those skilled in the art and all modifications coming within the teachings of this disclosure are intended to be covered by the following claims.

I claim:

1. A high gain high impedance direct-current amplifier circuit including input circuitry with feedthrough capacitors subject to temperature related pyroelectric effects, comprising a bridge circuit having temperature responsive impedances in one set of opposing legs and fixed impedances in the second set of opposing legs, a potentiometric device connected across one diagonal of said bridge having control means for producing a zero reference voltage between those appearing across said one diagonal, a direct-current reference voltage connected across the other diagonal of said bridge, wherein means for establishing the magnitude of said direct-current reference voltage includes: first and second direct voltage sources of opposite polarity, impedances connecting said sources to opposite ends of said other diagonal of said bridge, variable impedance means connected across said other diagonal of said bridge and adjustable to set the voltage at either end thereof to a direct voltage level between said first and second sources, said control means yielding an offset voltage for application to said amplifier that compensates for said pyroelectric effects as the ambient temperature changes.

2. An amplifier circuit as defined in claim 1, wherein said temperature responsive impedances are thermistors.

* * * * *